United States Patent
Moyal et al.

(10) Patent No.: US 6,172,571 B1
(45) Date of Patent: Jan. 9, 2001

(54) METHOD FOR REDUCING STATIC PHASE OFFSET IN A PLL

(75) Inventors: Nathan Y. Moyal; Bertrand J. Williams, both of Austin, TX (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/275,373

(22) Filed: Mar. 24, 1999

Related U.S. Application Data

(60) Provisional application No. 60/083,348, filed on Jul. 28, 1998.

(51) Int. Cl.$^7$ .................................................... H03L 7/093
(52) U.S. Cl. ................................. 331/11; 331/17; 331/25
(58) Field of Search .................................. 331/17, 25, 11

(56) References Cited

U.S. PATENT DOCUMENTS

| | | | |
|---|---|---|---|
| 4,388,596 | 6/1983 | Yamashita | 331/1 A |
| 4,692,718 | 9/1987 | Roza et al. | 331/113 R |
| 4,884,042 | 11/1989 | Menon et al. | 331/113 R |
| 5,075,639 | 12/1991 | Taya | 331/2 |
| 5,101,117 | 3/1992 | Johnson et al. | 307/269 |
| 5,119,043 | 6/1992 | Borwn et al. | 331/16 |
| 5,121,086 | 6/1992 | Srivastava | 331/11 |
| 5,157,355 | 10/1992 | Shikakura et al. | 331/11 |
| 5,194,828 | 3/1993 | Kato et al. | 331/1 A |
| 5,331,295 | 7/1994 | Jelinek et al. | 331/57 |
| 5,357,216 | 10/1994 | Nguyen | 331/25 |
| 5,375,148 | 12/1994 | Parker et al. | 375/120 |
| 5,412,349 | 5/1995 | Young et al. | 331/34 |
| 5,446,867 | 8/1995 | Young et al. | 395/550 |
| 5,455,840 | 10/1995 | Nakauchi et al. | 375/371 |
| 5,495,207 | 2/1996 | Novof | 331/57 |
| 5,550,493 | 8/1996 | Miyanishi | 327/66 |
| 5,596,614 | 1/1997 | Ledda | 375/376 |
| 5,619,161 | 4/1997 | Novof et al. | 327/535 |
| 5,631,591 | 5/1997 | Bar-Niv | 327/158 |
| 5,657,359 | 8/1997 | Sakae et al. | 375/376 |
| 5,684,844 | 11/1997 | Bouzidi et al. | 375/376 |
| 5,736,880 | 4/1998 | Bruccoleri et al. | 327/157 |
| 5,737,589 | 4/1998 | Doi et al. | 395/558 |
| 5,740,213 | 4/1998 | Dreyer | 375/374 |

*Primary Examiner*—Siegfried H. Grimm
(74) *Attorney, Agent, or Firm*—Christopher P. Maiorana, P.C.

(57) ABSTRACT

An architecture comprising a detector, a first pump circuit, a second pump circuit and a comparator. The detector may present a first active operating signal in response to one or more reference signals. In one example, the first active operating signal may be generated in response to a feedback signal having a parameter within a predetermined range. The first pump circuit may be configured to provide a replica pump signal in response to a current adjustment signal and either (i) at least one of the one or more reference signals or (ii) the first active operating signal. The second pump circuit may be configured to provide a voltage control signal in response to the current adjustment signal and either (i) the first active operating signal or (ii) a second, independent active operating signal. The comparator may be configured to provide the current adjustment signal in response to the replica pump signal and the voltage control signal.

14 Claims, 9 Drawing Sheets

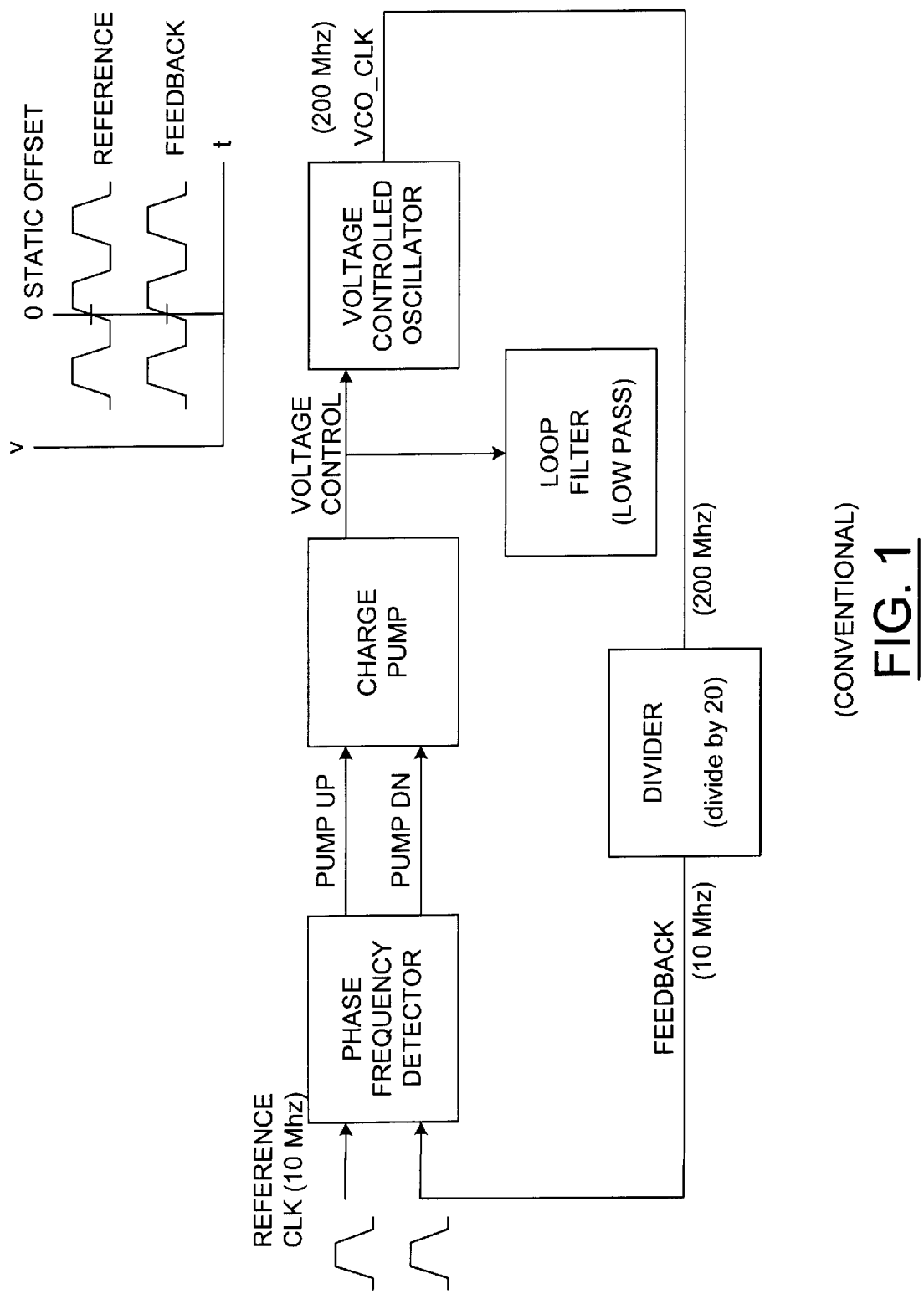
FIG. 1
(CONVENTIONAL)

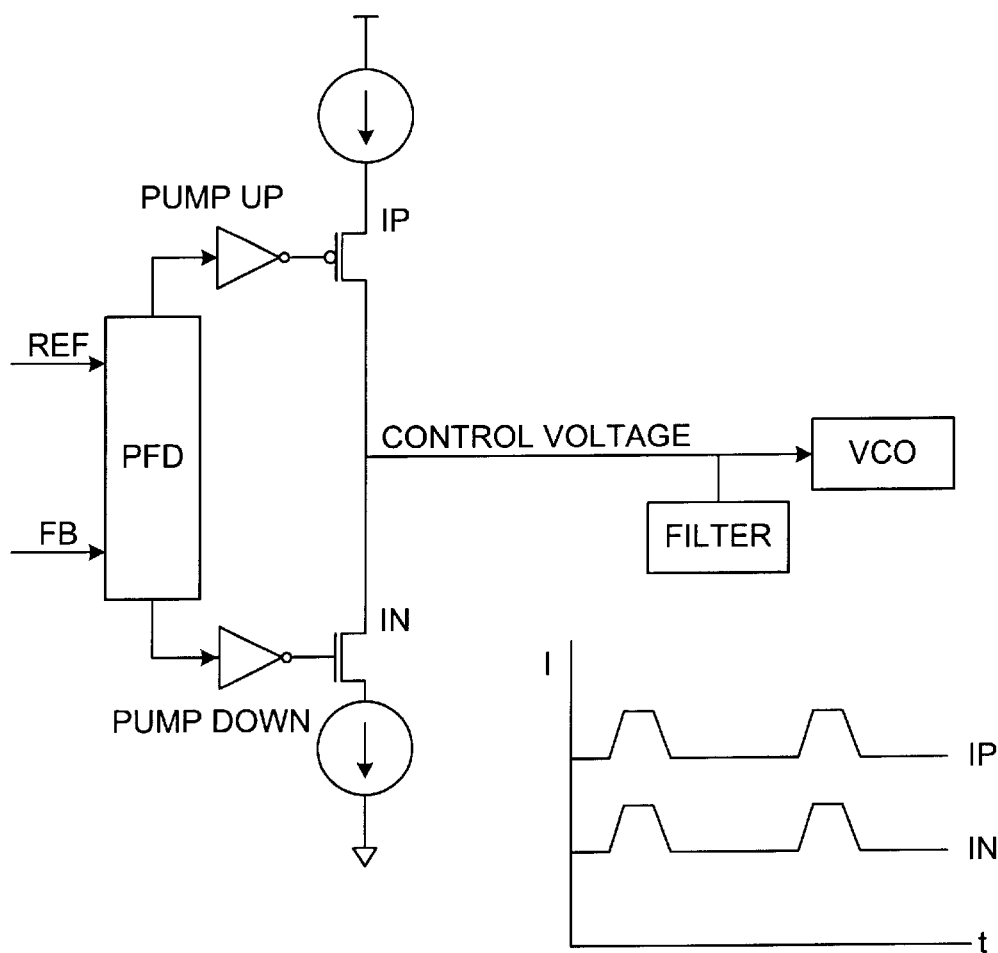
(CONVENTIONAL)
FIG. 2

METHOD FOR REDUCING STATIC PHASE OFFSET IN A PLL

This application claims the benefit of U.S. Provisional Application No. 60/083,348, filed Apr. 28, 1998, which is hereby incorporated by reference in its entirety.

FIELD OF THE INVENTION

The present invention relates to phase locked loops generally and, more particularly, to a circuit, method, and/or architecture for reducing static phase offset in a PLL and/or a digitally locked loop oscillator.

BACKGROUND OF THE INVENTION

Phase lock loops are clock multipliers. For example, an input clock signal oscillating at 10 Mhz can be multiplied by the PLL to yield an output clock signal oscillating at 200 Mhz. Ideally, this clock multiplication would result in a clock signal which is in perfect phase to a reference (i.e., zero static phase error). Any mismatch between the phase of the feedback clock to the reference clock is a phase offset. A diagram of a PLL is shown in FIG. 1.

It is desirable to keep the static phase error to a minimum. For a multiple chip application (e.g., where several PLL chips have one reference that also drives other chips) it is essential for the user to know the expected clock out (i.e., VCO_CLK) phase deviation from one PLL chip to the other.

During PLL lock, the pump currents into the filter will be equal. However, due to mismatch between the P-switch and the N-switch (typically, an NMOS device will transfer more current than a PMOS device since it is a faster switch) the loop has to mismatch the pulsewidth of the pumpup and the pumpdown signals. Another key mismatch concerns the drain to source VDS mismatch between the PMOS/NMOS switches. This is a function of control voltage operating point. This mismatch is linked directly to the reference clock which presents a feedback of the phase offset. The pumpup pulse is mismatched relative to the pumpdown pulse (the phase of REF differs from FB). This difference results in the phase offset.

Static phase error is caused by non-ideal elements in the PLL. Primarily, the charge pump followed by the phase frequency detector may cause static phase error. The PLL will start by locking to the desired frequency. However, due to the non-ideal elements, the PLL may have to shift the phase of the clock relative to the reference to achieve frequency lock. FIG. 2 illustrates such shifting.

Conventional approaches to reducing static phase offset may include (A) cascading PMOS and NMOS switches in order to reduce the drain to source Vds mismatch contribution, (B) implementing PMOS/NMOS switches with larger channel length (which lowers the channel modulation effect) in order to reduce the Vds mismatch contribution, (C) adding static phase offset to the phase frequency detector to cancel the error introduced by the pump, and (D) building differential charge pumps.

The disadvantages of Method A is that the cascading lowers the operating headroom current of the charge pump (i.e., the method can not use large currents). The cascading lowers the operating range (i.e., the output voltage) of the pump (i.e., less range on the VCO input) which can result in a high gain VCO that may be less immune to noise. However, static phase offset is still large (e.g., +/−250 ps at 155 Mhz). The output may be highly dependent on process, temperature, VCC, and output voltage. In order to match the pumpup and the pumpdown pulsewidths, it is essential to keep charge feed through (i.e., current spikes) on the switch to a minimum. This requirement forces the design to utilize small switch devices (i.e., low capacitance devices), and to match the spike characteristics of the PMOS and the NMOS switches, which is not generally an easy task to accomplish.

Method B not only has the disadvantages associated with Method A, but has the further disadvantage that it requires a large channel length that reduces the speed of the PMOS/NMOS switch (due to an increased load).

Method C has the disadvantage that the variation in the static phase offset magnitude over corners is still large. The only improvement provided by Method C is that the static offset is now centered around zero. The added delay in the PFD is highly dependent on proper delay modeling. This approach is highly dependent on process, temperature, VCC, and output voltage. In order to match the pumpup and the pumpdown pulsewidths, it is essential to keep charge feed through (i.e., current spikes) on the switch to a minimum. This requirement forces the design to utilize small switch devices, which have low capacitances, and to match the spike characteristics of the PMOS and the NMOS switches, which is not an easy task to accomplish.

Method D has the disadvantage that it depends on process, temperature, VCC, and output voltage (typically, improved from the single ended). However, such an approach (i) requires stable common mode circuitry, (ii) requires more pump circuitry, (iii) could require additional input buffering, (iv) requires more layout room, and (v) requires careful schematic and layout matching. In order to match the pumpup and the pumpdown pulsewidths, it is essential to keep charge feed through (i.e., current spikes) on the switch to a minimum. This requirement forces the design to utilize small switch devices, which have low capacitances, and to match the spike characteristics of the PMOS and the NMOS switches, which is not an easy task to accomplish.

SUMMARY OF THE INVENTION

The present invention concerns an architecture comprising a detector, a first pump circuit, a second pump circuit and a comparator. The detector may present a first active operating signal in response to one or more reference signals. In one example, the first active operating signal may be generated in response to a feedback signal having a parameter within a predetermined range. The first pump circuit may be configured to provide a replica pump signal in response to a current adjustment signal and either (i) at least one of the one or more reference signals or (ii) the first active operating signal. The second pump circuit may be configured to provide a voltage control signal in response to the current adjustment signal and either (i) the first active operating signal or (ii) a second, independent active operating signal. The comparator may be configured to provide the current adjustment signal in response to the replica pump signal and the voltage control signal.

The objects, features and advantages of the present invention include providing a circuit that may (i) reduce static phase error independently of process, temperature, VCC and/or output voltages, (ii) provide a low static phase offset, (ii) provide a low static phase offset without special cascading for output voltage immunity, (iv) reduce feed through currents (current spikes), (v) allow a large amount of design flexibility, and/or (vi) run at very low power supplies.

BRIEF DESCRIPTION OF THE DRAWINGS

These and other objects, features and advantages of the present invention will be apparent from the following detailed description and the appended claims and drawings in which:

FIG. 1 is a block diagram of a conventional PLL;

FIG. 2 is a diagram illustrating static phase error in PLL;

DETAILED DESCRIPTION OF THE PREFERRED EMBODIMENTS

Figure 3:
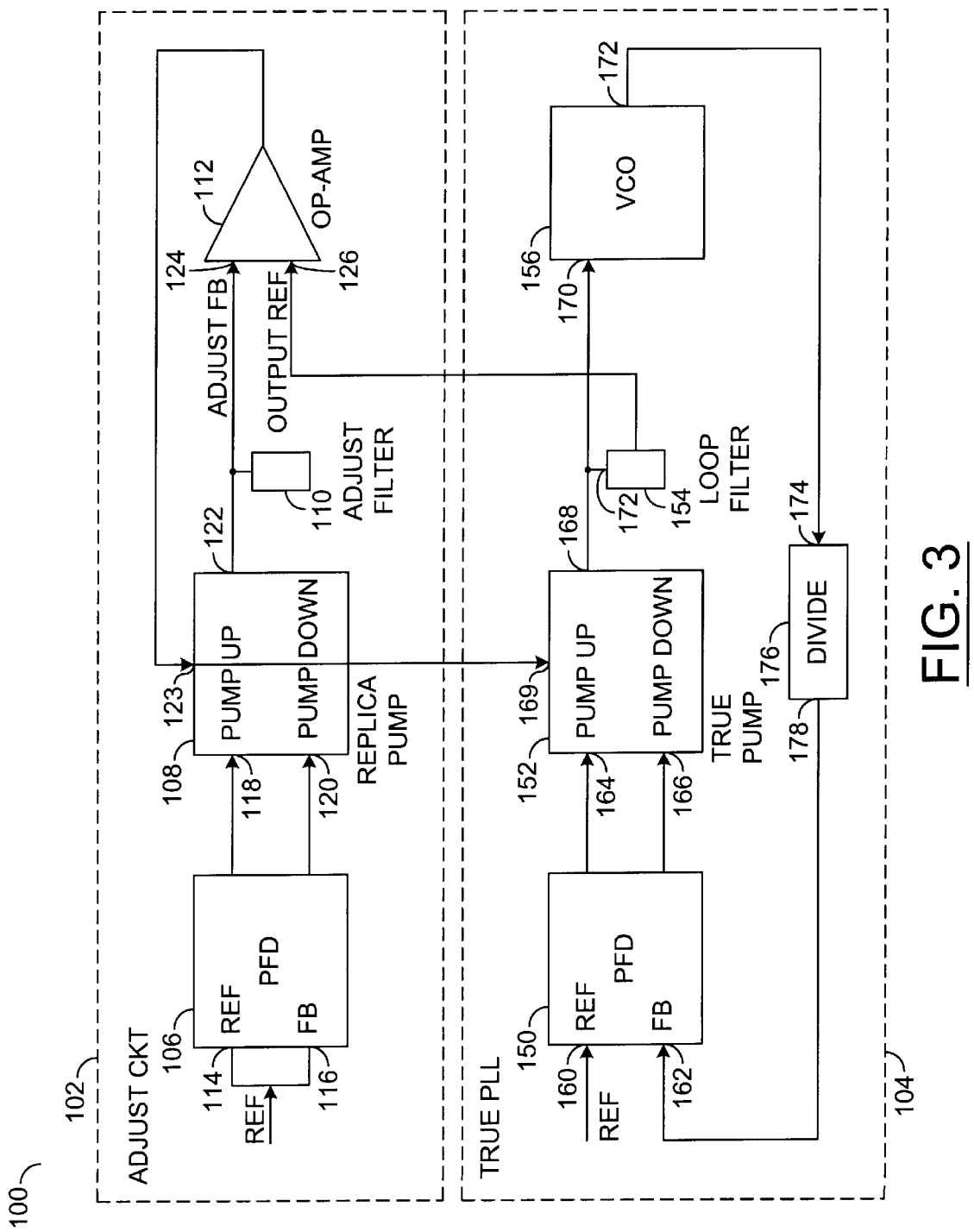
FIG. 3 is a block diagram of a preferred embodiment of the present invention.

Referring to FIG. 3, a block diagram of a circuit 100 is shown in accordance with a preferred embodiment of the present invention. The circuit 100 generally comprises an adjustment circuit 102 and a PLL circuit 104. The adjustment circuit 102 generally comprises a phase frequency detector (PFD) 106, a replica pump circuit 108, a filter circuit 110 and an operational amplifier (or comparator) 112. The PFD 106 generally receives a reference signal (e.g., REF) at an input 114 and at an input 116. The replica pump 108 generally comprises an input 118 that may receive the signal from the PFD 106 and an input 120 that may receive a signal from the PFD 106. The replica pump circuit 108 may present a signal (e.g., ADJUST_FB) at an output 122. The signal ADJUST_FB may be presented to an input 124 of the operational amplifier 112. A signal (e.g., OUTPUTREF) may also be presented to an input 126 of the operational amplifier 112.

The PLL circuit generally comprises a PFD 150, a pump circuit 152, a filter circuit 154 and a voltage control oscillator (VCO) 156. The PFD 150 generally receives the signal REF at an input 160 and a signal (e.g., FB) at an input 162. The PFD generally presents a first signal that may be received at an input 164 of the pump circuit 152 and a second signal that may be received at an input 166 of the pump circuit 152. The pump circuit 152 may also have an output 168 that may present a signal to an input 170 of the VCO 156 as well as to an input 172 of the filter 154. The filter 154 may present the signal OUTPUTREF to the adjustment circuit 102. The VCO 156 may present the signal at an output 172 that may be received at an input 174 of a divide block 176. The divide block 176 may have an output 178 that may present the signal FB that may be received at the input 162.

Figure 4:
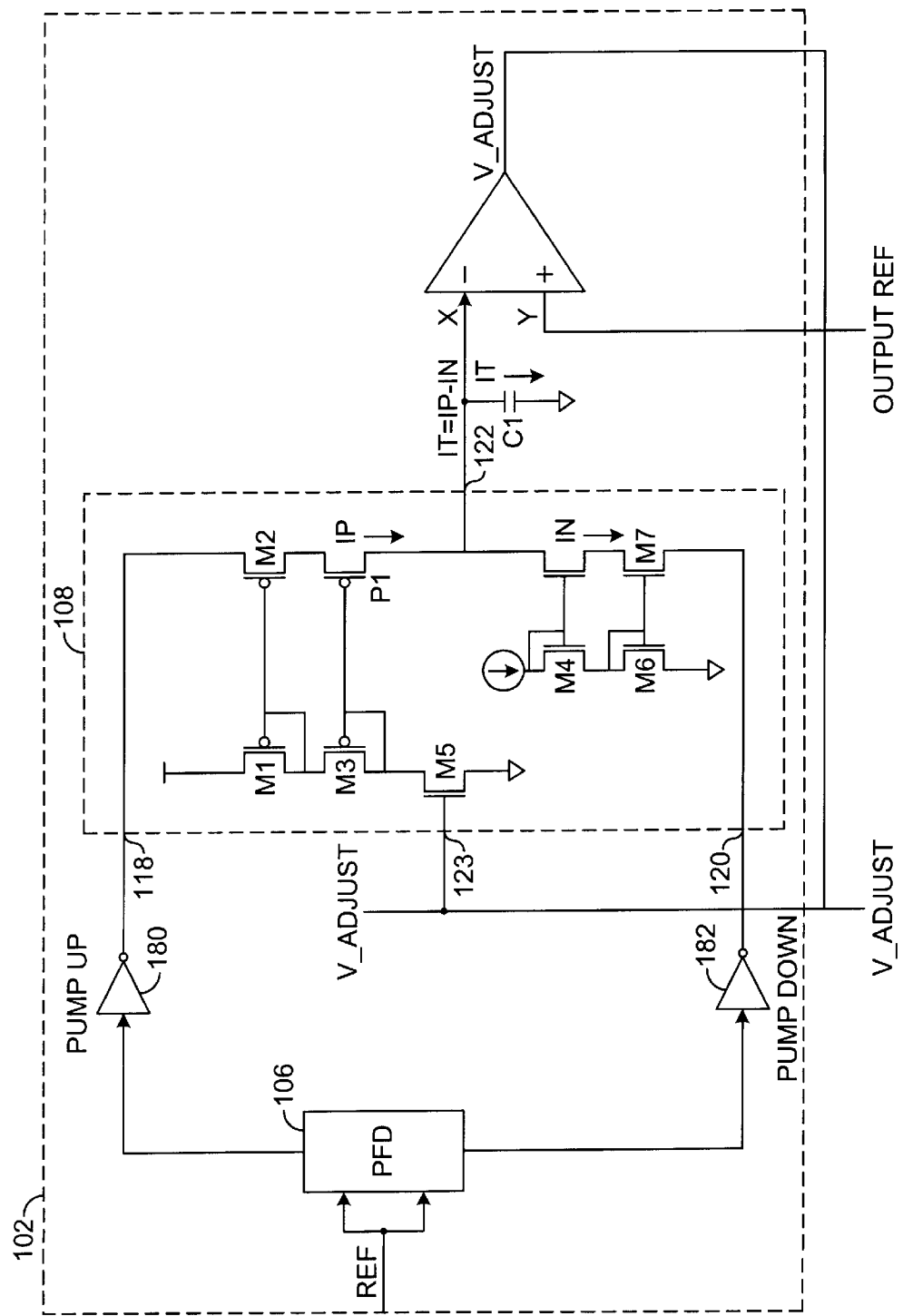
FIG. 4 is a circuit diagram of the replica circuit of FIG. 3.
Figure 5:
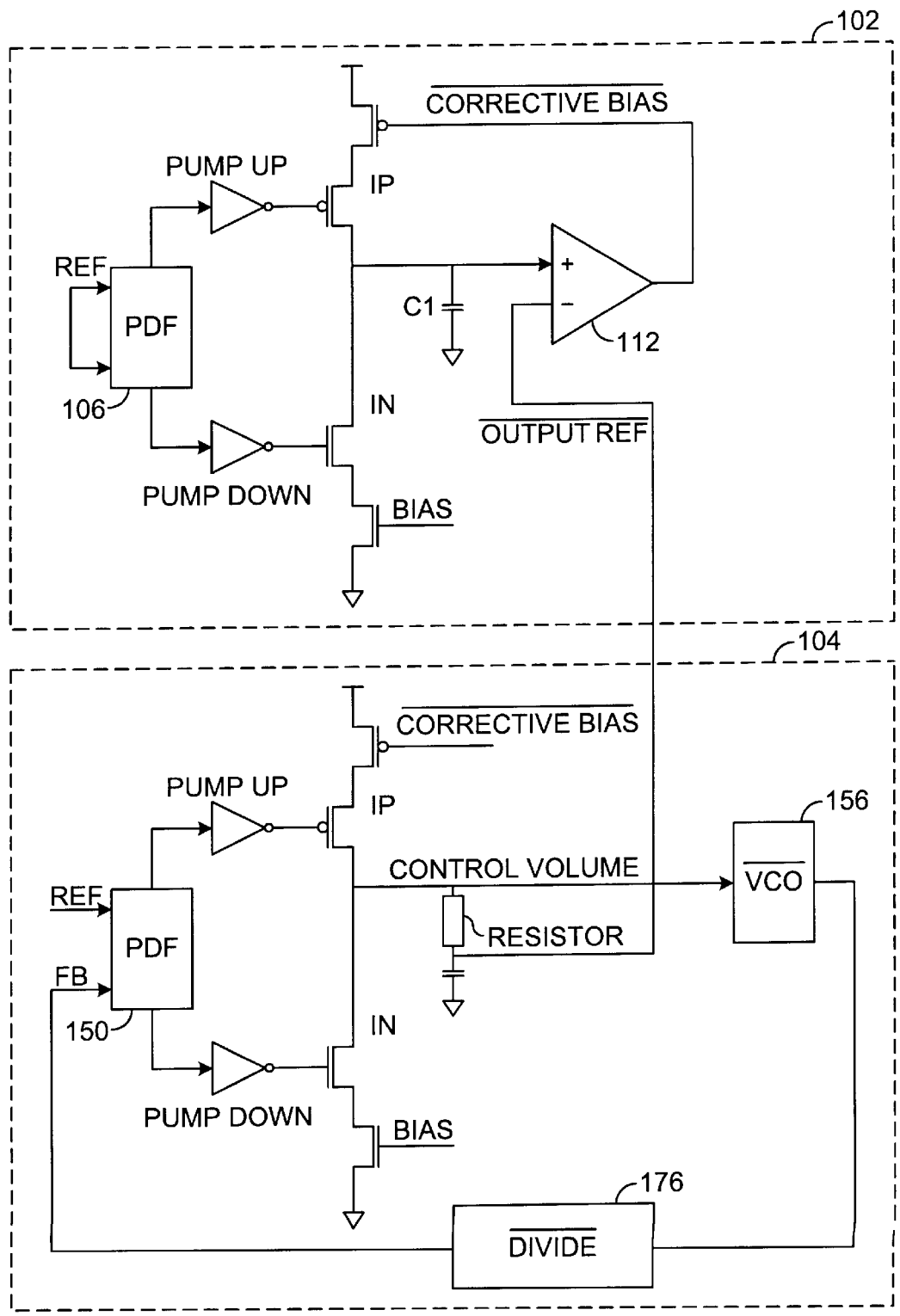
FIG. 5 is an alternate implementation of the present invention.
Figure 6:
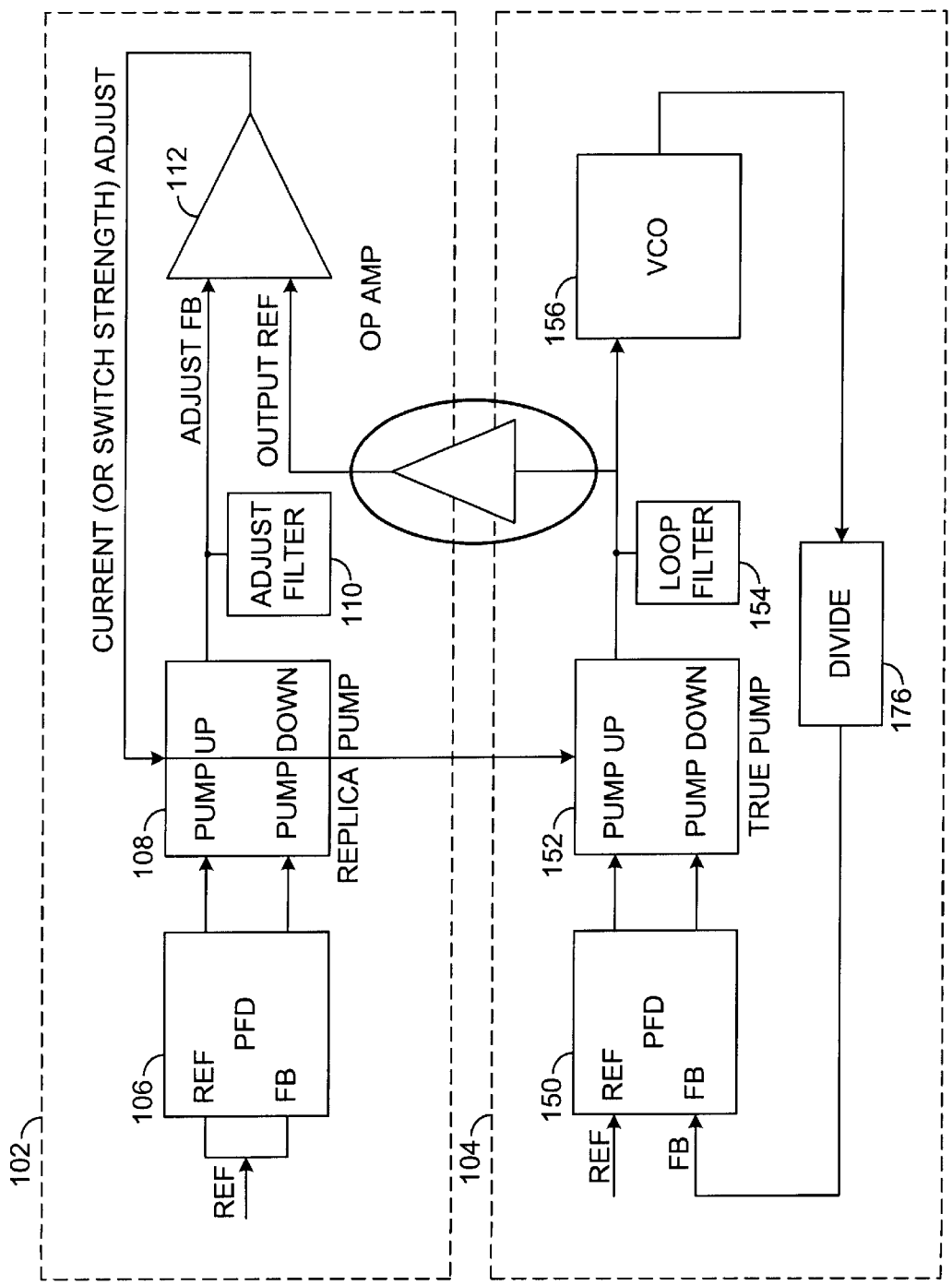
FIG. 6 is a another alternate implementation of the present invention.
Figure 7:
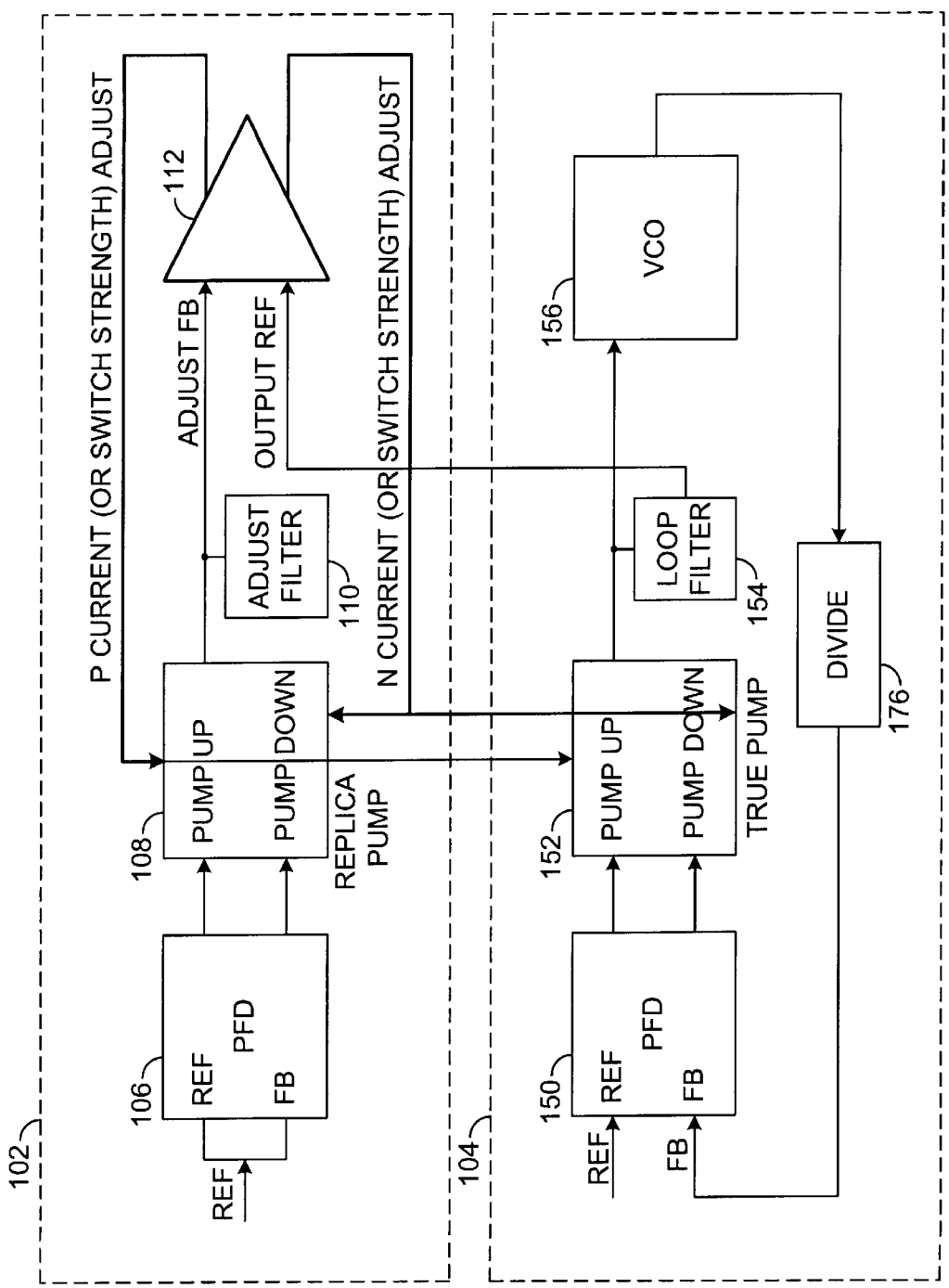
FIG. 7 is a another alternate implementation of the present invention.
Figure 8:
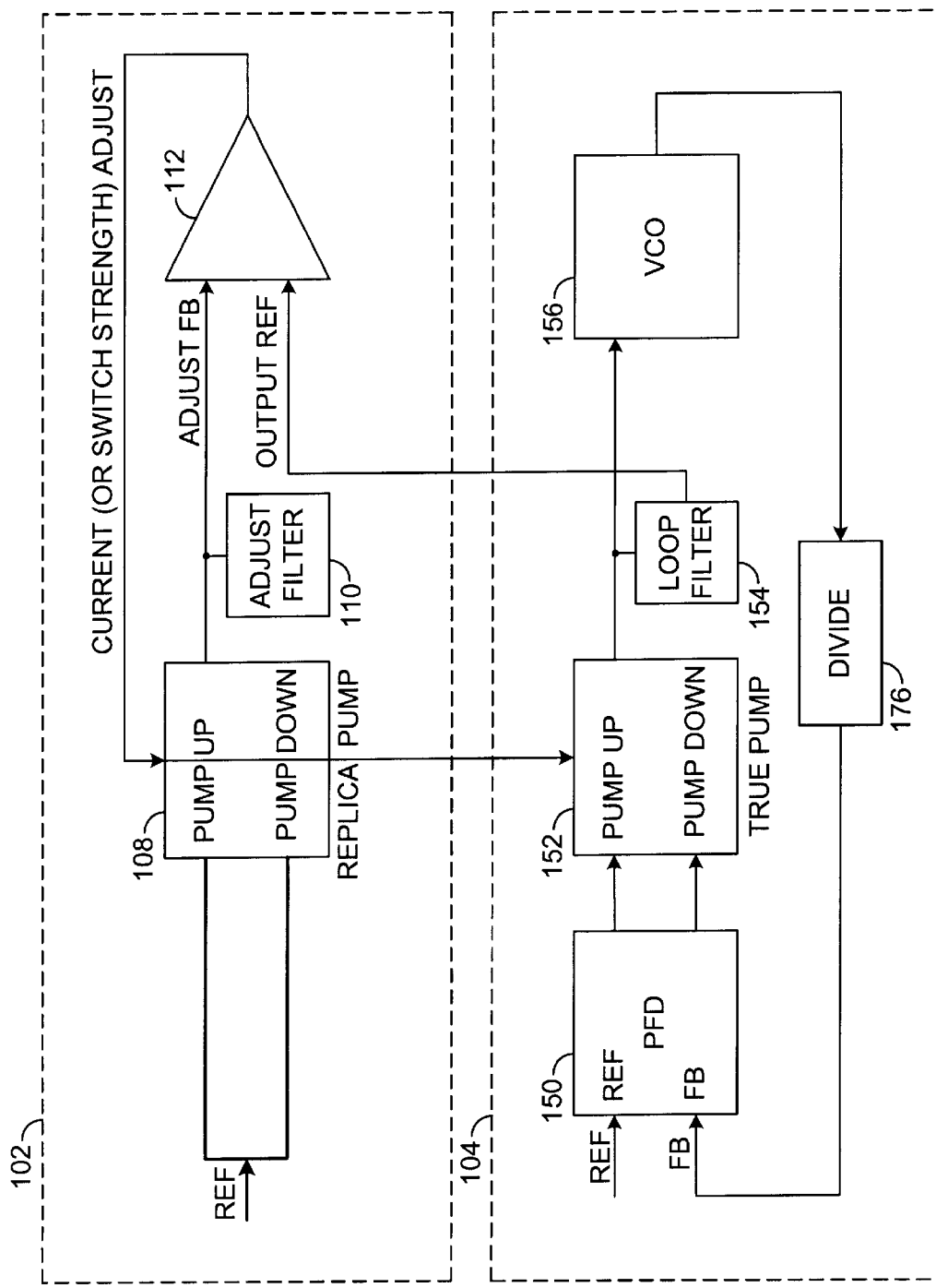
FIG. 8 is a another alternate implementation of the present invention.
Figure 9:
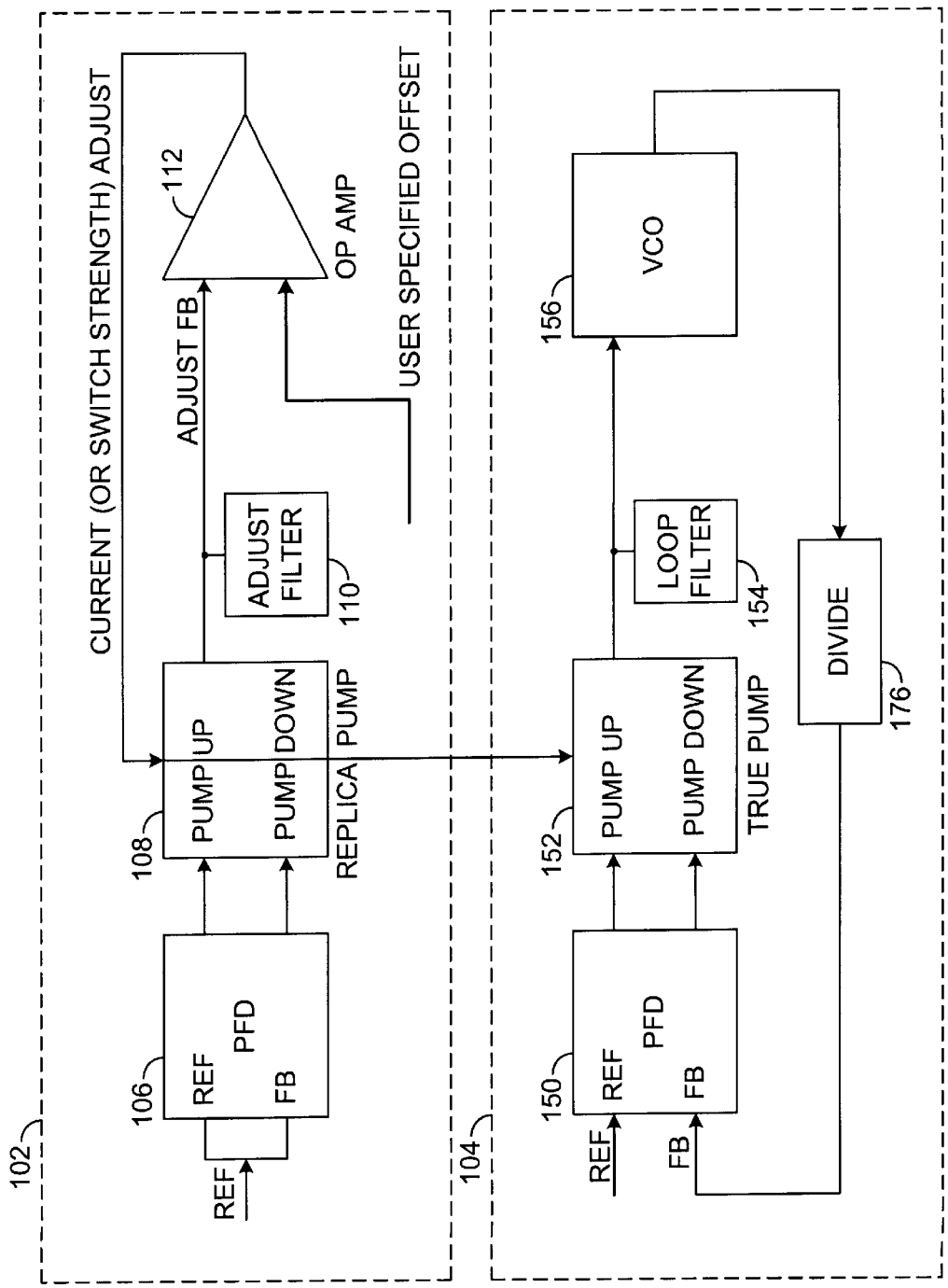
FIG. 9 is a another alternate implementation of the present invention.

Referring to FIG. 4, a more detailed diagram of the adjustment circuit 102 is shown. The circuit 102 is shown further comprising an inverter 180 and an inverter 182 that may be coupled before the inputs 118 and 120, respectively. The pump circuit 108 is shown generally comprising a transistor M1, a transistor M2, a transistor M3, a transistor Pi, a transistor N1, a transistor M4, a transistor M5, a transistor M6 and a transistor M7. The adjust filter 104 may be implemented as a capacitor C1.

The circuit 100 may provide improvements that may be based on ensuring that the PMOS and the NMOS switches (e.g., P1 and N1) are matched in current strength for an ideal pulsewidth that is generally independent of output voltage, VCC, temperature, and process corners. The circuit 100 may provide such matching using a dynamic corrective close loop architecture.

The circuit 100 may use the replica pump circuit 108 that includes an adjustable current control in response to the signal V_ADJUST. A frequency locked signal from the PFD 106 is generally presented to the inputs 118 and 120 of the replica pump circuit 108. In one example, the PFD 106 may be implemented as a frequency detect circuit or a clock reference circuit. The frequency locked signal may force the circuit 100 to accept perfectly matched pumpup and pumpdown signals, which may result in a current pulse relative to the up pulse and a current pulse proportional to the down pulse. In a perfect zero static phase offset system, these pulses should be exactly identical, and the output current is also zero. However, in a practical system, a difference may occur when the pump currents charge (or discharge) the capacitor C1. The charge on the capacitor C1 may be compared to the signal OUTPUTREF using the operational amplifier 112. The signal OUTPUTREF generally reflects the output voltage of the pump 152 (e.g., the output voltage tracking) The output of the operational amplifier 112 is generally presented as a feedback to a current control input (e.g., 123 and 169) of the replica pump 108 and the charge pump 152, respectively. The operational amplifier 122 may adjust one side of the pump current relative to the complement of the pump current.

The circuit 100 may be implemented as a dynamic corrective close loop system that may be fully adjusted when the signal OUTPUTREF and the charge on the capacitor C1 are equal. This may force the signal pumpup and the pumpdown to be the same (e.g., a frequency lock condition) and may adjust the dynamic currents of the pump to match the output voltages of the true pump 152. The current adjustment is generally reflected from the replica circuit to the true pump 152. This may yield a pump with nearly zero static offset over process, temperature, VCC, and output voltage.

In FIG. 4, the PFD 106 may be sending signals which may duplicate a lock condition with zero static phase offset. Ideally, the pumpup pulsewidth and the pumpdown pulsewidth will be nearly identical if no static phase offset is introduced by the PFD 106.

During a pump switch mismatch, the PMOS switch P1 may not be as fast as the NMOS switch N1. Such a mismatch may result in the current Ip<In, and the current It presented to the capacitor C1 being negative. A node X will be pulled lower than a node Y. This generally results in the signal V_ADJUST increasing due to the operator of the operational amplifier 112. The increase in the signal V_ADJUST will produce more current Ip. This adjustment will generally take place until the current Ip=In, and the node X matches the reference node Y. The V-adjustment will generally be reflected into the pump 152.

During an voltage mismatch, the output of the charge pump 152 (input to the VCO 156) may be set just above ground at low VCO speeds, and near the VCC rail for fast VCO speeds. During a locked condition, the amount of current Ip vs. the current In may vary as a function of the output voltage of the charge pump, due to a drain to source Vds mismatch. In the extreme case, one switch may operate in the linear region, while the other switch may operate in saturation. Since the circuit 100 may be tracking the output voltage on the pump 152, which is generally reflected into the replica circuit, the switches response may be matched. If one switch is "weaker" (e.g., yields lower net charge) than the other, the close loop replica structure generally compensates by adjusting the amount of current.

The operational amplifier 112, the filters 110 and 154, the charge pumps 108 and 152, and charge pump compensation circuit 102 may be implemented in a variety of ways to meet the design criteria of a particular application. Several examples of such implementations are shown in FIGS. 5–9. For example, FIG. 5 may implement the VCO 156 as a VCOb, FIG. 6 may implement a buffer 200 between the filter 154 and the operational amplifier 112, FIG. 7 may implement the operational amplifier 112 as presenting a true and a complement signal to both the charge pump 108 and the charge pump 152, FIG. 8 may present the signal REF directly to the charge pump 108 (e.g., without the PFD 106) and FIG. 9 may present a user specified offset to the operational amplifier 112.

The present invention may provide (i) a closed loop architecture and method for reducing static phase offset in PLL, (ii) a method and architecture used for current matching in a charge pump, (iii) a method and architecture used for charge pump output voltage compensation, (iv) an architecture and method for reducing static phase offset in the charge pump and (v) the architecture and method for reducing static phase offset in the PFD.

The present invention may save overall design time since PLL designers often spend a large amount of time trying to design systems with low static phase error. This may be particularly time consuming since static phase error is not just an absolute value, but varies over corners, temperature, VCC, and VCO frequency ranges. The present invention offers a closed loop, self adjusting solution. Feasibility simulations show much improvement in the performance of the charge pump with the proposed architecture over standard designs. The present invention may offer a flexible architectural umbrella which can be applied to a large number of designs. The combination of specific applications and architectural concepts should make this invention very attractive.

While the invention has been particularly shown and described with reference to the preferred embodiments thereof, it will be understood by those skilled in the art that various changes in form and details may be made without departing from the spirit and scope of the invention.

What is claimed is:

1. An architecture comprising:
    a) a first chase frequency detector that outputs a first active operating signal in response to one or more reference signals;
    b) a first charge pump circuit configured to provide a replica pump signal in response to (I) a current adjustment signal and (II) either (i) at least one of said one or more reference signals or (ii) said first active operating signal;
    c) a second charge pump circuit configured to provide a voltage control signal in response to said current adjustment signal and either said first active operating signal or a second, independent active operating signal; and
    d) a comparator configured to provide said current adjustment signal in response to said replica pump signal and said voltage control signal.

2. The architecture of claim 1, wherein said first phase frequency detector outputs said first active operating signal in response to a first reference signal, and said architecture further comprises:
    a) a second phase frequency detector that outputs a second active operating signal in response to a second reference signal and a feedback signal.

3. The architecture according to claim 2, wherein said architecture further comprises one or more of the following:
    b) a first filter coupled to said first charge pump circuit and said comparator, configured to filter said replica pump signal; and
    c) a second filter coupled to said second charge pump circuit, said comparator and an oscillator, configured to filter said voltage control signal.

4. The architecture of claim 3, wherein said oscillator is configured to provide a periodically oscillating signal in response to said voltage control signal.

5. The architecture of claim 4, wherein said periodically oscillating signal is also said feedback signal.

6. The architecture of claim 4, wherein said architecture provides at least one function selected from the group consisting of (i) reducing static phase offset in said oscillator, and (ii) reducing effects on said periodically oscillating signal of variations in one or more parameters selected from the group consisting of manufacturing and/or process conditions, operating temperature, operating voltage, and output voltage.

7. The architecture according to claim 1, wherein said first active operating signal is generated in response to a feedback signal having a parameter within a predetermined range.

8. A circuit comprising:
    a) a first charge pump circuit configured to provide a feedback adjustment signal in response to (i) a current adjustment signal and (ii) one or more reference signals or one or more pump control signals; and
    b) a comparator configured to provide said current adjustment signal to both said first charge pump circuit and a second charge pump circuit providing an input to an oscillator in response to said feedback adjustment signal and a voltage control signal from said second pump circuit.

9. The circuit of claim 8, wherein:
    a) said first charge pump circuit provides said feedback adjustment signal in response to (i) said current adjustment signal, (ii) a first pump control signal to increase current flow to the comparator, and (iii) a second pump control signal to decrease current flow to the comparator; and
    b) said circuit further comprises a phase frequency detector that outputs said first and second pump control signals in response to one or more reference signals.

10. The circuit of claim 9, wherein said first charge pump circuit comprises (i) a first pump control circuit configured to increase current flow to the comparator in response to the first pump control signal, and (ii) a second pump control circuit configured to decrease current flow to the comparator in response to the second pump control signal; and (iii) a current adjustment circuit configured to adjust the current output of at least one of said first and second pump control circuits in response to said current adjustment signal.

11. The circuit of claim 10, further comprising a filter coupled to said first charge pump circuit and said comparator.

12. The circuit of claim 8, wherein said circuit provides at least one function selected from the group consisting of (i) reducing static phase offset in said oscillator, and (ii) reducing effects of variations in one or more parameters selected from the group consisting of (a) manufacturing and/or process conditions, (b) operating temperature, (c) operating voltage, and (d) output voltage, on a periodically oscillating signal generated by said oscillator.

13. A method of reducing static phase offset in an oscillator comprising the steps of:

a) comparing current outputs of essentially identical first and second charge pump circuits, and b) adjusting the current output of at least one of said first and second charge pump circuits in response thereto, wherein at least one of said first and second charge pump circuits provides an input to said oscillator.

14. The method of claim 13, wherein the adjusting step adjusts the current output of both of said first and second charge pump circuits.

* * * * *